(12) United States Patent
Chang et al.

(10) Patent No.: US 10,067,389 B2
(45) Date of Patent: Sep. 4, 2018

(54) TFT ARRAY SUBSTRATE AND LIQUID CRYSTAL DISPLAY PANEL

(71) Applicant: HON HAI PRECISION INDUSTRY CO., LTD., New Taipei (TW)

(72) Inventors: Wun-Zong Chang, Hsinchu (TW); Te-Wei Chan, Hsinshu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 181 days.

(21) Appl. No.: 14/928,356

(22) Filed: Oct. 30, 2015

(65) Prior Publication Data

US 2016/0349555 A1 Dec. 1, 2016

(30) Foreign Application Priority Data

May 27, 2015 (TW) .............................. 104116942 A

(51) Int. Cl.
| | | |
|---|---|---|
| G02F 1/1343 | (2006.01) | |
| H01L 27/12 | (2006.01) | |
| H01L 29/423 | (2006.01) | |
| H01L 29/786 | (2006.01) | |
| G02F 1/1362 | (2006.01) | |

(52) U.S. Cl.
CPC ...... *G02F 1/134309* (2013.01); *H01L 27/124* (2013.01); *H01L 29/42384* (2013.01); *H01L 29/786* (2013.01); *G02F 1/136286* (2013.01); *G02F 2001/134372* (2013.01)

(58) Field of Classification Search
CPC ... G02F 1/134309; G02F 2001/134372; H01L 29/41; H01L 27/124
See application file for complete search history.

(56) References Cited

U.S. PATENT DOCUMENTS

2003/0231149 A1* 12/2003 Kawamura ....... G02F 1/134363 345/76

FOREIGN PATENT DOCUMENTS

TW 201415146 A 4/2014

* cited by examiner

*Primary Examiner* — Phu Vu
(74) *Attorney, Agent, or Firm* — ScienBiziP, P.C.

(57) ABSTRACT

A thin film transistor (TFT) array substrate includes a plurality of data lines, at least one first common electrode, and at least one resistance reduction structure. The resistance reduction structure is connected to the first common electrodes and located corresponding to one of the data lines.

12 Claims, 7 Drawing Sheets

TFT ARRAY SUBSTRATE AND LIQUID CRYSTAL DISPLAY PANEL

CROSS-REFERENCE TO RELATED APPLICATIONS

This application claims priority to Taiwanese Patent Application No. 104116942 filed on May 27, 2015, the contents of which are incorporated by reference herein.

FIELD

The subject matter herein generally relates to a thin film transistor (TFT) array substrate and a liquid crystal display panel using the TFT array substrate.

BACKGROUND

A familiar liquid crystal display includes a thin film transistor (TFT) array substrate, an opposite substrate, and a liquid crystal layer sandwich between the TFT array substrate and the opposite substrate. The TFT array substrate may includes a plurality of scan lines, a plurality of data lines, a plurality of pixel electrodes, and a plurality of common electrodes. Each of the common electrodes has a resistance.

BRIEF DESCRIPTION OF THE DRAWINGS

Implementations of the present technology will now be described, by way of example only, with reference to the attached figures.

DETAILED DESCRIPTION

Figure 1:
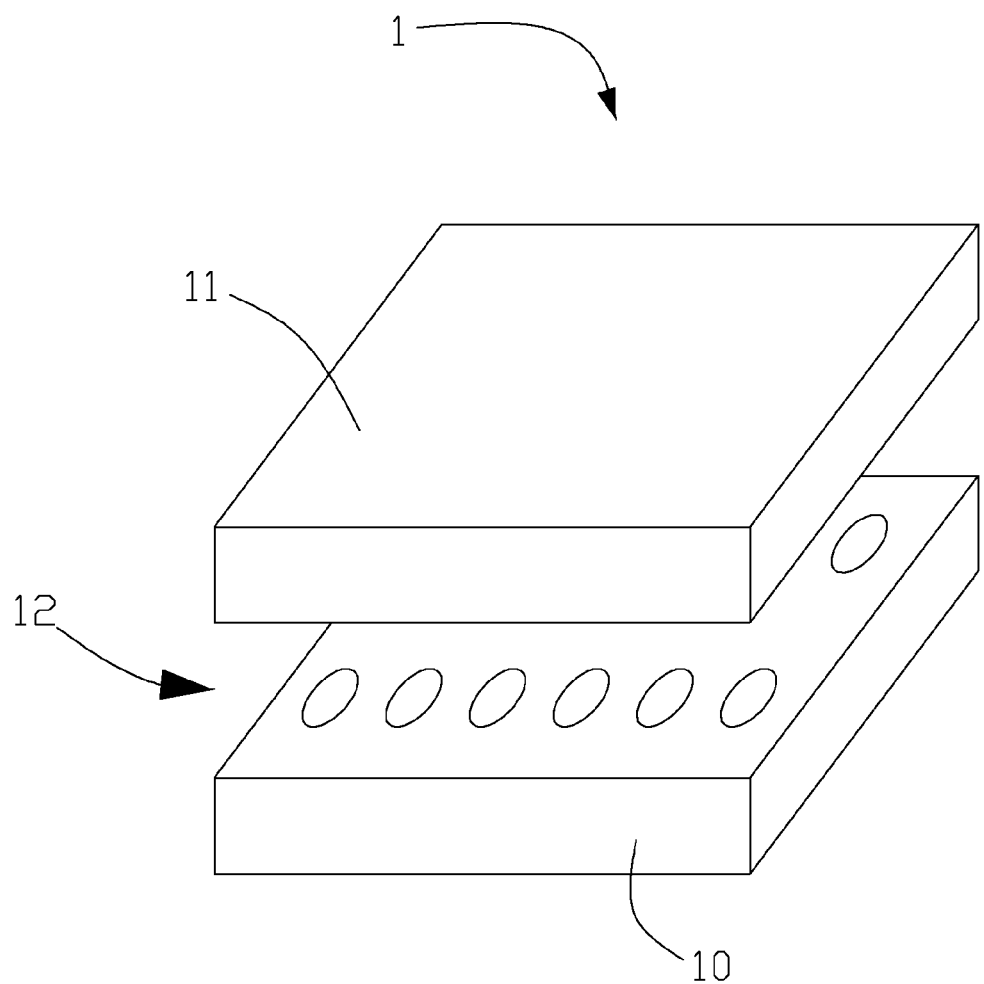
FIG. 1 is an isometric view of display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

FIG. 1 illustrates a liquid crystal display panel 1 according to the present disclosure. The liquid crystal display panel 1 includes an array substrate 10, an opposite substrate 11, and a liquid crystal layer 12 sandwiched between the array substrate 10 and the opposite substrate 11. In the illustrated embodiment, the array substrate 10 is a thin film transistor (TFT) array substrate, and the opposite substrate 11 is a color filter substrate.

Figure 2:
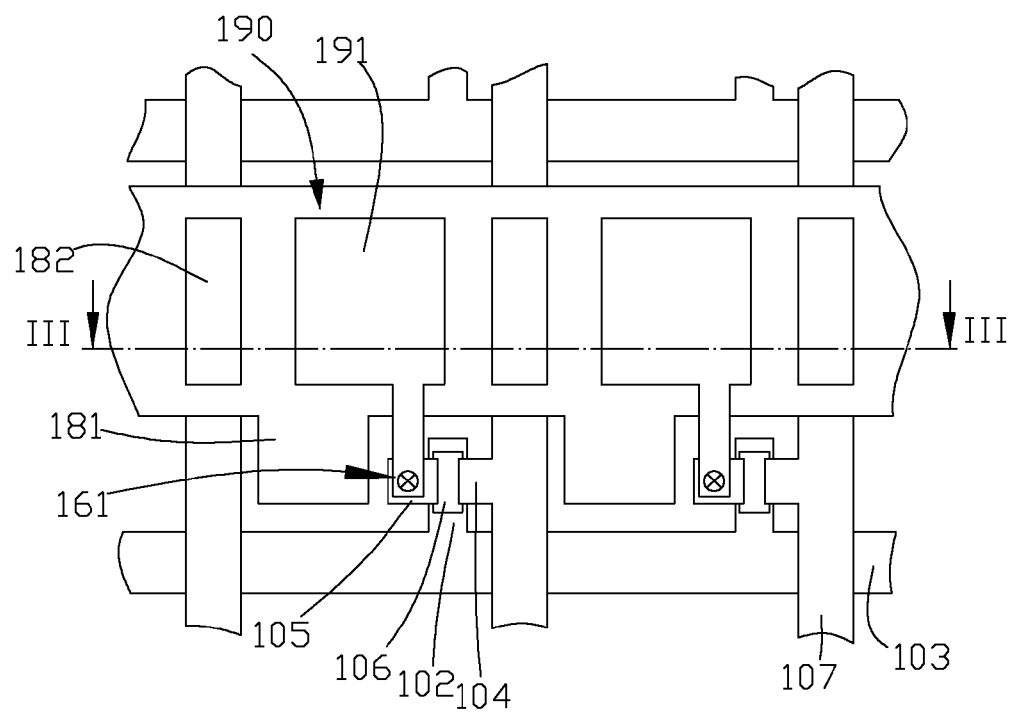
FIG. 2 is a top view of a TFT array substrate of a first embodiment of the display panel.
Figure 3:
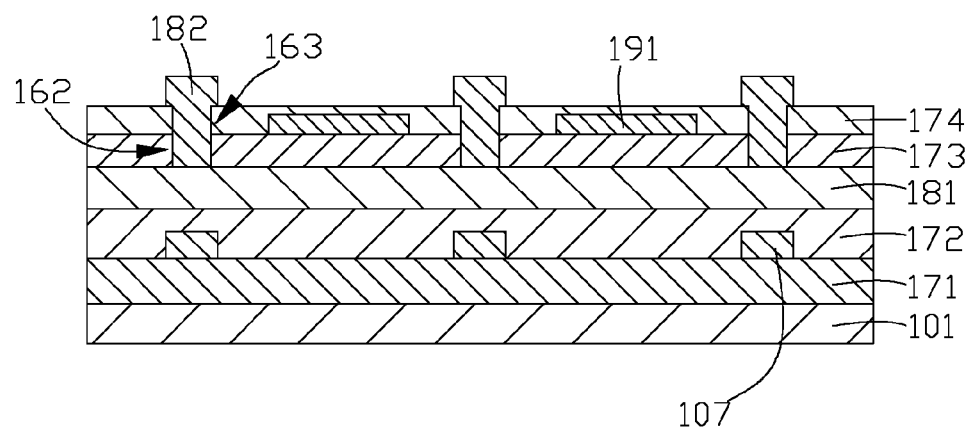
FIG. 3 is a cross-sectional view of the TFT array substrate of FIG. 2, taken along a line III-III.

FIG. 2 and FIG. 3 illustrate that the array substrate 10 of a first embodiment includes a plurality of scan lines 103 and a plurality of data lines 107. The scan lines 103 and the data lines 107 cross each other and define a plurality of pixel areas 190. Each of the pixel areas 190 includes at least one gate electrode 102, one source electrode 104, one drain electrode 105, one channel 106, and one pixel electrode 191. The array substrate 10 further includes a substrate 101, a gate insulation layer 171, a data insulation layer 172, a plurality of first common electrodes 181, a first overcoat layer 173, a second overcoat layer 174, and a plurality of second common electrodes 182.

The gate electrode 102 is formed on the substrate 101. The gate insulation layer 171 is formed on the substrate and covers the gate electrode 102. The channel 106 is formed on the gate insulation layer 171 corresponding to the gate electrode 102. The source electrode 104 and the drain electrode 105 are formed on the gate insulation layer 171 and cover two sides of the channel 106 respectively. The data lines 107 are formed on the gate insulation layer 171.

The data insulation layer 172 is formed on the gate insulation layer 171 and covers the source electrode 104, the channel 106, the drain electrode 105, and the data lines 107. The first common electrode 181 is formed on the data insulation layer 172. The first overcoat layer 173 is formed on the first common electrode 181. The pixel electrode 191 is formed on the first overcoat layer 173. A hole 161 is defined in the first overcoat layer 173. The pixel electrode 191 is coupled to the drain electrode 105 through the hole 161. The second overcoat layer 174 is formed on the first overcoat layer 173 and the pixel electrode 191. A first common electrode hole 162 is defined in the first overcoat layer 173 corresponding to the data line 107. A second common electrode hole 163 is defined in the second overcoat layer 174 corresponding to the first common electrode hole 162. The second common electrode 182 is electrically connected to the corresponding first common electrode 181 through the first common electrode hole 162 and the second common electrode hole 163.

In the illustrated embodiment, the substrate 101 is made of transparent materials, such as glass, quartz, or organic polymer. The gate electrode 102, the scan line 103, the source electrode 104, the drain electrode 105, and the data line 107 are made of metal, such as aluminum, titanium, molybdenum, tantalum, copper, or any combination above. The channel 106 is made of semiconductors, such as metal oxide, amorphous silicon, or polycrystalline silicon. The gate insulation layer 171, the data insulation layer 172, the first overcoat layer 173, and the second overcoat layer 174 are made of transparent insulation materials, such as silicon oxide, silicon nitride, or silicon oxynitride. The pixel electrode 191 is made of transparent conductive materials, such as indium tin oxide. In the illustrated embodiment, the first common electrode 181 is made of transparent conductive materials, such as indium tin oxide. In the illustrated embodiment, the second common electrode 182 is made of metal, such as aluminum, titanium, molybdenum, tantalum, copper, or any combination above.

In the illustrated embodiment, the first common electrode 181 is electrically connected to the second common electrode 182, and a resistance of the first common electrode 181 is reduced. Further, the second common electrode 182 may prevent electric field interference between two adjacent pixel electrodes 191. Furthermore, the second common electrode 182 may increase a storage capacity between the pixel electrode 191 and the first common electrode 181.

Figure 4:
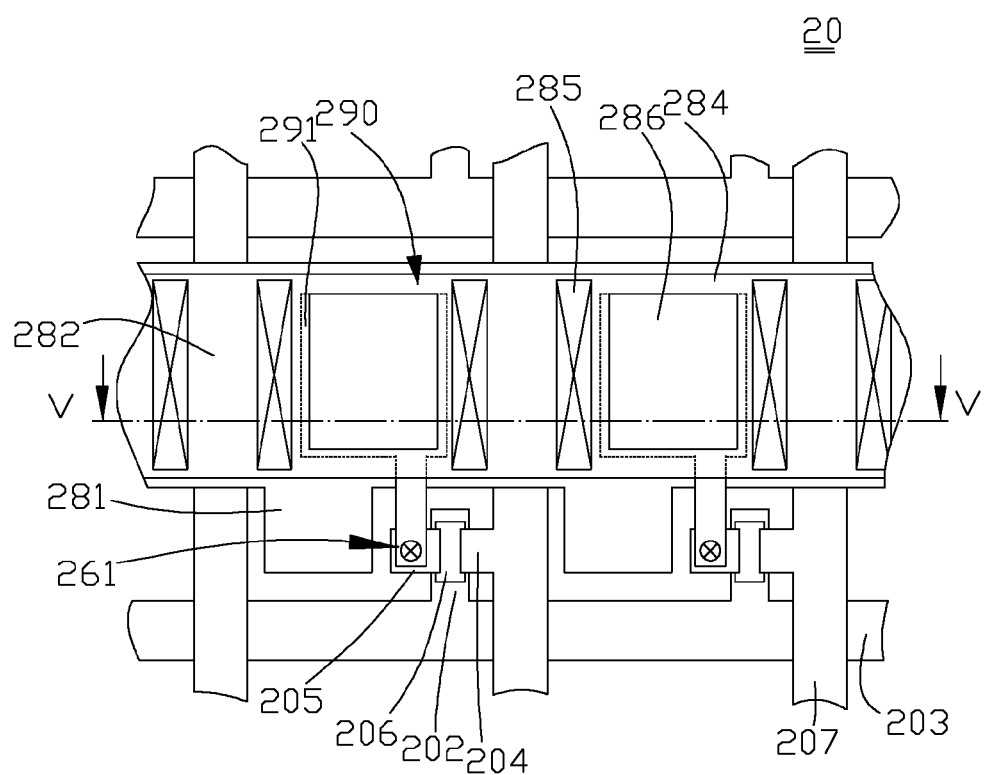
FIG. 4 is a top view of a TFT array substrate of a second embodiment of the display panel.
Figure 5:
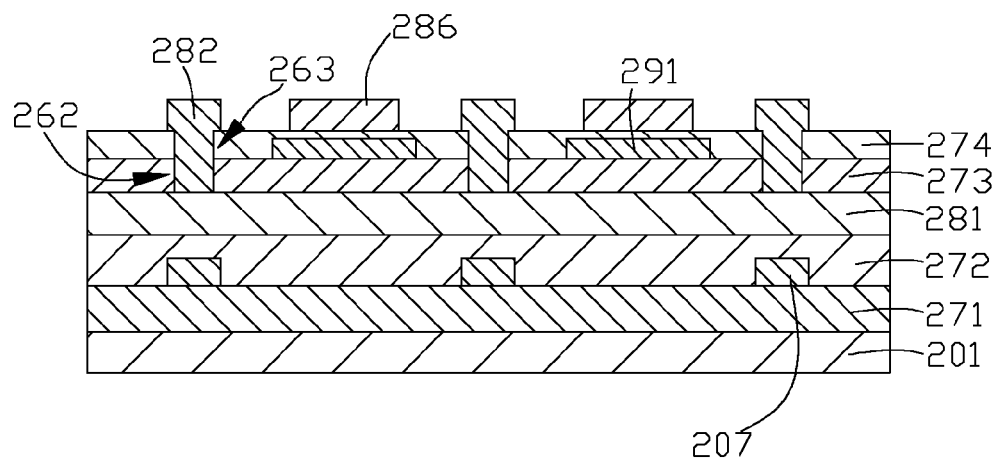
FIG. 5 is a cross-sectional view of the TFT array substrate of FIG. 4, taken along a line V-V.

FIG. 4 and FIG. 5 illustrate that an array substrate 20 of a second embodiment includes a plurality of scan lines 203 and a plurality of data lines 207. The scan lines 203 and the data lines 207 cross each other and define a plurality of pixel areas 290. Each of the pixel areas 290 includes at least one gate electrode 202, one source electrode 204, one drain electrode 205, one channel 206, one pixel electrode 291, and one extending portion 284. The array substrate 20 further includes a substrate 201, a gate insulation layer 271, a data insulation layer 272, a plurality of first common electrodes 281, a first overcoat layer 273, a second overcoat layer 274, and a plurality of second common electrodes 282.

The gate electrode 202 is formed on the substrate 201. The gate insulation layer 271 is formed on the substrate and covers the gate electrode 202. The channel 206 is formed on the gate insulation layer 271 corresponding to the gate electrode 202. The source electrode 204 and the drain electrode 205 are formed on the gate insulation layer 271 and cover two sides of the channel 206 respectively. The data lines 207 are formed on the gate insulation layer 271.

The data insulation layer 272 is formed on the gate insulation layer 271 and covers the source electrode 204, the channel 206, the drain electrode 205, and the data lines 207. The first common electrode 281 is formed on the data insulation layer 272. The first overcoat layer 273 is formed on the first common electrode 281. The pixel electrode 291 is formed on the first overcoat layer 273. A hole 261 is defined in the first overcoat layer 273. The pixel electrode 291 is coupled to the drain electrode 205 through the hole 261. The second overcoat layer 274 is formed on the first overcoat layer 273 and the pixel electrode 291. A first common electrode hole 262 is defined in the first overcoat layer 273 corresponding to the data line 207. A second common electrode hole 263 is defined in the second overcoat layer 274 corresponding to the first common electrode hole 262. The second common electrode 282 is electrically connected to the first common electrode 281 through the first common electrode hole 262 and the second common electrode hole 263.

The extending portion 284 is extended from one of the second common electrode 282, and located upon the pixel electrode 291. The extending portion 284 is electrically connected to the adjacent second common electrode 282. The extending portion 284 defines two slits 285. The extending portion 284 comprises a plurality of extending bridges 286. The extending bridge 286 located between two adjacent slits 285 is disposed upon the corresponding pixel electrode 291.

In the illustrated embodiment, the substrate 201 is made of transparent materials, such as glass, quartz, or organic polymer. The gate electrode 202, the scan line 203, the source electrode 204, the drain electrode 205, and the data line 207 are made of metal, such as aluminum, titanium, molybdenum, tantalum, copper, or any combination above. The channel 206 is made of semiconductors, such as metal oxide, amorphous silicon, or polycrystalline silicon. The gate insulation layer 271, the data insulation layer 272, the first overcoat layer 273, and the second overcoat layer 274 are made of transparent insulation materials, such as silicon oxide, silicon nitride, or silicon oxynitride. The pixel electrode 291 is made of transparent conductive materials, such as indium tin oxide. In the illustrated embodiment, the first common electrode 281, the second common electrode 282, the extending portion 284, and the extending bridge 286 are made of transparent conductive materials, such as indium tin oxide.

In the illustrated embodiment, the first common electrode 281 is electrically connected to the second common electrode 282, and a resistance of the first common electrode 281 is reduced. Further, the second common electrode 282 may prevent electric field interference between two adjacent pixel electrodes 291. Furthermore, the second common electrode 282 may increase a storage capacity between the pixel electrode 291 and the first common electrode 281. In the illustrated embodiment, the extending portion 284 further reduce the resistance of the first common electrode 281 and increase the storage capacity between the pixel electrode 291 and the first common electrode 281 than the first embodiment.

Figure 6:
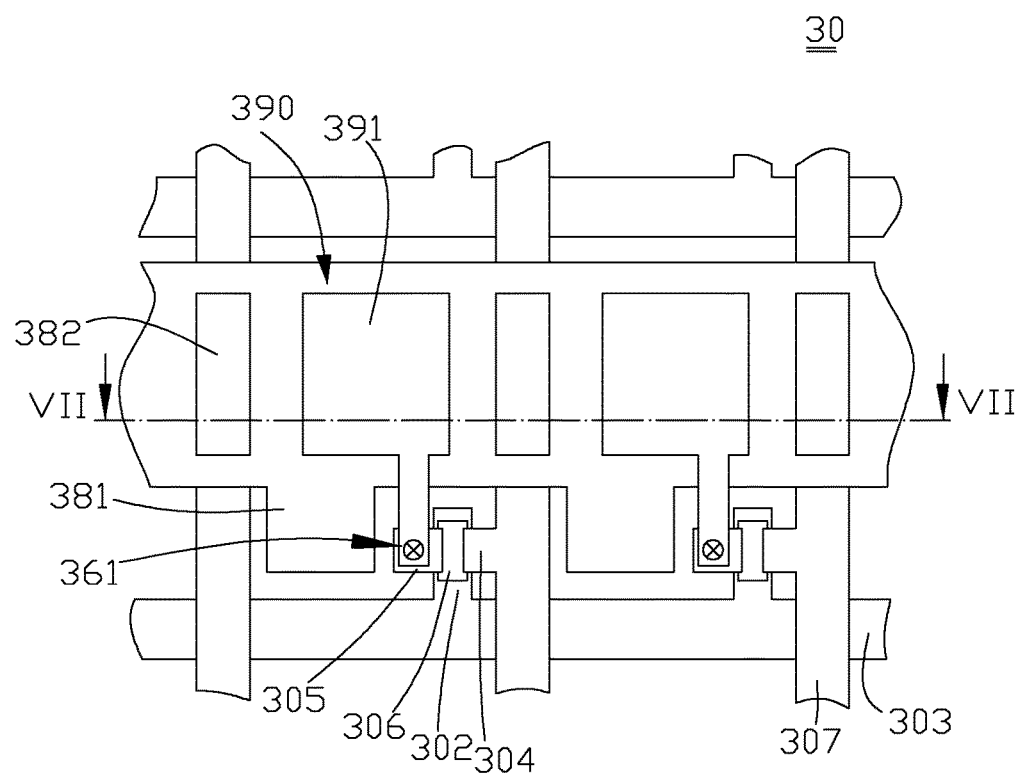
FIG. 6 is a top view of a TFT array substrate of a third embodiment of the display panel.
Figure 7:
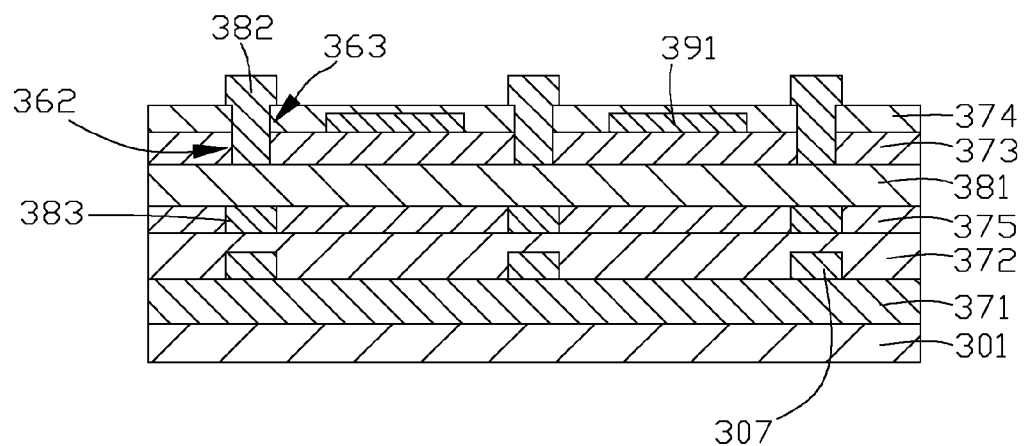
FIG. 7 is a cross-sectional view of the TFT array substrate of FIG. 6, taken along line a VII-VII.

FIG. 6 and FIG. 7 illustrate that an array substrate 30 of a third embodiment includes a plurality of scan lines 303 and a plurality of data lines 307. The scan lines 303 and the data lines 307 cross each other and define a plurality of pixel area 390. Each of the pixel area 390 includes at least one gate electrode 302, one source electrode 304, one drain electrode 305, one channel 306, and one pixel electrode 391. The array substrate 30 further includes a substrate 301, a gate insulation layer 371, a data insulation layer 372, a plurality of resistance reduction portions 383, a plurality of packing portions 375, a plurality of first common electrodes 381, a first overcoat layer 373, a second overcoat layer 374, and a plurality of second common electrodes 382.

The gate electrode 302 is formed on the substrate 301. The gate insulation layer 371 is formed on the substrate and covers the gate electrode 302. The channel 306 is formed on the gate insulation layer 371 corresponding to the gate electrode 302. The source electrode 304 and the drain electrode 305 are formed on the gate insulation layer 371 and cover two sides of the channel 306 respectively. The data lines 307 are formed on the gate insulation layer 371.

The data insulation layer 372 is formed on the gate insulation layer 371 and covers the source electrode 304, the channel 306, the drain electrode 305, and the data lines 307. The resistance reduction portion 383 is located on the data insulation layer 372 corresponding to the data lines 307. The packing portion 375 is located between two adjacent resistance reduction portions 383. The first common electrode 381 is formed on the resistance reduction portions 383 and the packing portions 375, and is electrically connected to the resistance reduction portions 383. The first overcoat layer 373 is formed on the first common electrode 381. The pixel electrode 391 is formed on the first overcoat layer 373. A hole 361 is defined in the first overcoat layer 373. The pixel electrode 391 is coupled to the drain electrode 305 through the hole 361. The second overcoat layer 374 is formed on the first overcoat layer 373 and the pixel electrode 391. A first common electrode hole 362 is defined in the first overcoat layer 373 corresponding to the data line 307. A second common electrode hole 363 is defined in the second overcoat layer 374 corresponding to the first common electrode hole 362. The second common electrode 382 is electrically connected to the first common electrode 381 through the first common electrode hole 362 and the second common electrode hole 363. The second common electrode 382 faces to the resistance reduction portion 383 along a direction perpendicular to the substrate 301.

In the illustrated embodiment, the substrate 301 is made of transparent materials, such as glass, quartz, or organic polymer. The gate electrode 302, the scan line 303, the source electrode 304, the drain electrode 305, and the data line 307 are made of metal, such as aluminum, titanium, molybdenum, tantalum, copper, or any combination above. The channel 306 is made of semiconductors, such as metal oxide, amorphous silicon, or polycrystalline silicon. The gate insulation layer 371, the data insulation layer 372, the first overcoat layer 373, and the second overcoat layer 374 are made of transparent insulation materials, such as silicon oxide, silicon nitride, or silicon oxynitride. The pixel electrode 391 is made of transparent conductive materials, such as indium tin oxide. In the illustrated embodiment, the first common electrode 381 is made of transparent conductive materials, such as indium tin oxide. In the illustrated embodiment, the second common electrode 182 can be made of metal or transparent conductive materials. In the illustrated embodiment, the resistance reduction portion 383 is made of metal, such as aluminum, titanium, molybdenum, tantalum, or copper.

In the illustrated embodiment, the first common electrode 381 is electrically connected to the second common electrode 382 and the resistance reduction portion 383, and a resistance of the first common electrode 381 is reduced. Further, the second common electrode 382 may prevent electric field interference between two adjacent pixel electrodes 391. Furthermore, the second common electrode 382 and the resistance reduction portion 383 may increase a storage capacity between the pixel electrode 391 and the first common electrode 381. In the illustrated embodiment, the resistance reduction portion 383 further reduce the resistance of the first common electrode 381 and increase the storage capacity between the pixel electrode 391 and the first common electrode 381 than the first embodiment.

The embodiments shown and described above are only examples. Many details are often found in the art such as the other features of a TFT array substrate, a display panel using the TFT array substrate, and a method for manufacturing the TFT array substrate. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A thin film transistor (TFT) array substrate comprising:
a plurality of data lines;
a plurality of first common electrodes; and
at least one resistance reduction structure electrically connected to the first common electrodes and located corresponding to one of the data lines;
wherein the resistance reduction structure comprises a resistance reduction portion electrically connected to the first common electrode, the resistance reduction portion is located between the first common electrode and the corresponding data lines, and the resistance reduction portion is made of metal;
wherein the TFT array substrate further comprises a plurality of pixel electrodes, each of the plurality of pixel electrodes is located between two adjacent data lines and the plurality of pixel electrodes are insulated each other, the resistance reduction structure further comprises at least one second common electrode electrically connected to the first common electrode, the second common electrode is located at a surface of the first common electrode away from the resistance reduction portion, the second common electrode faces the resistance reduction portion;
wherein the TFT array substrate further comprises a first overcoat layer and a second overcoat layer, the first overcoat layer is formed on and covers the first common electrode, the pixel electrodes are formed on the first overcoat layer, the second overcoat layer is formed on the first overcoat layer and covers the pixel electrodes, a first common electrode hole is defined in the first overcoat layer corresponding to the data line, a second common electrode hole is defined in the second overcoat layer corresponding to the first common electrode hole, the second common electrode is coupled to the first common electrode through the first common electrode hole and the second common electrode hole;
wherein the second common electrode further comprises an extending portion, the extending portion is extended from one of the second common electrode, located upon the pixel electrode, and electrically connected to the adjacent second common electrode;
wherein the TFT array substrate further comprises a plurality of scan lines, the scan lines and the data lines cross each other and define a plurality of pixel areas, the extending portion defines two slits, the extending portion comprises a plurality of extending bridges, the extending bridge located between two adjacent slits is disposed upon the corresponding pixel electrode.

2. The TFT array substrate of claim 1, wherein the TFT array substrate further comprises a data insulation layer and a packing portion, the resistance reduction portion and the packing portion are formed on the data insulation layer, the packing portion is formed between two adjacent resistance reduction portions, the first common electrode is formed on the resistance reduction portion and the packing portion.

3. The TFT array substrate of claim 2, wherein the TFT array substrate further comprises a gate insulation layer, the data lines are formed on the gate insulation layer, the data insulation layer is formed on the gate insulation layer and covers the data lines.

4. The TFT array substrate of claim 3, wherein the TFT array substrate further comprises a substrate, the gate insulation layer is formed on the substrate.

5. The TFT array substrate of claim 4, wherein the TFT array substrate further comprises a gate electrode, a source electrode, a drain electrode, and a channel, the gate electrode is formed on the substrate and is covered by the gate insulation layer, the channel is formed on the gate insulation layer corresponding to the gate electrode, the source electrode and the drain electrode are formed on the gate insulation layer and cover two sides of the channel respectively.

6. A liquid crystal display panel comprising:
a thin film transistor (TFT) array substrate, comprising:
a plurality of data lines;
a plurality of first common electrodes; and
at least one resistance reduction structure electrically connected to the first common electrodes and located corresponding to one of the data lines;
an opposite substrate; and
a liquid crystal layer sandwiched between the TFT array substrate;
wherein the resistance reduction structure comprises a resistance reduction portion electrically connected to the first common electrode, the resistance reduction portion is located between the first common electrode and the corresponding data lines, and the resistance reduction portion is made of metal;

wherein the TFT array substrate further comprises a plurality of pixel electrodes, each of the plurality of pixel electrodes is located between two adjacent data lines and the plurality of pixel electrodes are insulated each other, the resistance reduction structure further comprises at least one second common electrode electrically connected to the first common electrode, the second common electrode is located at a surface of the first common electrode away from the resistance reduction portion, the second common electrode faces the resistance reduction portion;

wherein the TFT array substrate further comprises a first overcoat layer and a second overcoat layer, the first overcoat layer is formed on and covers the first common electrode, the pixel electrodes are formed on the first overcoat layer, the second overcoat layer is formed on the first overcoat layer and covers the pixel electrodes, a first common electrode hole is defined in the first overcoat layer corresponding to the data line, a second common electrode hole is defined in the second overcoat layer corresponding to the first common electrode hole, the second common electrode is coupled to the first common electrode through the first common electrode hole and the second common electrode hole;

wherein the second common electrode further comprises an extending portion, the extending portion is extended from one of the second common electrode, located upon the pixel electrode, and electrically connected to the adjacent second common electrode;

wherein the TFT array substrate further comprises a plurality of scan lines, the scan lines and the data lines cross each other and define a plurality of pixel areas, the extending portion defines two slits, the extending portion comprises a plurality of extending bridges, the extending bridge located between two adjacent slits is disposed upon the corresponding pixel electrode.

7. The liquid crystal display panel of claim 6, wherein the TFT array substrate further comprises a data insulation layer and a packing portion, the resistance reduction portion and the packing portion are formed on the data insulation layer, the packing portion is formed between two adjacent resistance reduction portions, the first common electrode is formed on the resistance reduction portion and the packing portion.

8. The liquid crystal display panel of claim 7, wherein the TFT array substrate further comprises a gate insulation layer, the data lines are formed on the gate insulation layer, the data insulation layer is formed on the gate insulation layer and covers the data lines.

9. The liquid crystal display panel of claim 8, wherein the TFT array substrate further comprises a substrate, the gate insulation layer is formed on the substrate.

10. The liquid crystal display panel of claim 9, wherein the TFT array substrate further comprises a gate electrode, a source electrode, a drain electrode, and a channel, the gate electrode is formed on the substrate and is covered by the gate insulation layer, the channel is formed on the gate insulation layer corresponding to the gate electrode, the source electrode and the drain electrode are formed on the gate insulation layer and cover two sides of the channel respectively.

11. A thin film transistor (TFT) array substrate comprising:
a plurality of data lines parallel to each other;
a plurality of first common electrodes stacked on the plurality of data lines;
a resistance reduction portion electrically connected to one of the plurality of first common electrodes and located corresponding to one of the plurality of data lines, wherein the resistance reduction portion is located on a surface of the first common electrode adjacent to the plurality of data lines, the resistance reduction portion is made of metal; and
at least one second common electrode electrically connected to one of the plurality of first common electrodes and located corresponding to one of the plurality of data lines, wherein the at least one second common electrode is located at a surface of the first common electrode away from the plurality of data lines.

12. A liquid crystal display panel comprising:
a thin film transistor (TFT) array substrate;
an opposite substrate; and
a liquid crystal layer sandwiched between the TFT array substrate;
the TFT array substrate comprising:
a plurality of data lines parallel to each other;
a plurality of first common electrodes stacked on the plurality of data lines;
a resistance reduction portion electrically connected to one of the plurality of first common electrodes and located corresponding to one of the plurality of data lines, wherein the resistance reduction portion is located on a surface of the first common electrode adjacent to the plurality of data lines, the resistance reduction portion is made of metal; and
at least one second common electrode electrically connected to one of the plurality of first common electrodes and located corresponding to one of the plurality of data lines, wherein the at least one second common electrode is located at a surface of the first common electrode away from the plurality of data lines.

* * * * *